United States Patent [19]

Anderson

[11] Patent Number: 5,277,746

[45] Date of Patent: Jan. 11, 1994

[54] HIGH PRESSURE LIQUID PHASE EPITAXY REACTOR CHAMBER AND METHOD WITH DIRECT SEE THROUGH CAPABILITY

[75] Inventor: Jeffrey M. Anderson, Garland, Tex.

[73] Assignee: Texas Instruments Incorporated, Dallas, Tex.

[21] Appl. No.: 920,407

[22] Filed: Jul. 27, 1992

[51] Int. Cl.$^5$ ............................................. C30B 19/08
[52] U.S. Cl. ................................ 156/603; 156/621; 437/130; 437/949; 118/404; 118/713
[58] Field of Search ............... 437/130, 949; 118/713, 118/400, 402, 403; 148/DIG. 22 156/621, 623 R

[56] References Cited

U.S. PATENT DOCUMENTS

| | | | |
|---|---|---|---|
| 3,704,093 | 11/1972 | Haggerty et al. | 148/DIG. 22 |
| 3,994,755 | 11/1976 | Kamath et al. | 156/624 |
| 4,026,735 | 5/1977 | Kamath et al. | 156/624 |
| 4,242,307 | 12/1980 | Fally | 156/624 |
| 4,401,487 | 8/1983 | Lockwood | 156/624 |
| 4,711,697 | 12/1987 | Kaukler | 156/624 |
| 5,082,625 | 1/1992 | Wakatsuki et al. | 156/623 R |

Primary Examiner—Olik Chaudhuri
Assistant Examiner—Ramamohan Rao Paladugu
Attorney, Agent, or Firm—Richard A. Stoltz; James C. Kesterson; Richard L. Donaldson

[57] ABSTRACT

An apparatus (10) and method are provided for directly viewing, through a viewport assembly (26), the process for forming a layer of mercury cadmium telluride of a predetermined composition on a surface of a wafer (not shown). According to the invention, a molten melt (20) comprising mercury, cadmium and tellurium is provided in a vertically oriented crystal growth chamber (14), which, in turn, is housed in a reactor tube (12). A wafer (not shown) is contacted with the crystal growth melt while cooling the melt below its liquidus temperature at a predetermined rate sufficient to cause a crystal growth layer of mercury cadmium telluride to form on the wafer (not shown). Viewports (26, 48) located approximately radially adjacent to the melt (22) provide direct see through capability to visually monitor the crystal growth process. The present invention is advantageous because the apparatus and method disclosed provide for ease of the growth set-up and operation, yielding mercury cadmium telluride layers of uniform composition and of high purity.

4 Claims, 4 Drawing Sheets

HIGH PRESSURE LIQUID PHASE EPITAXY REACTOR CHAMBER AND METHOD WITH DIRECT SEE THROUGH CAPABILITY

TECHNICAL FIELD OF THE INVENTION

The present invention relates to reactor chambers and methods and, more particularly, to a high pressure liquid phase epitaxial reactor chamber and method with direct see through capability.

BACKGROUND OF THE INVENTION

A technique used in semiconductor materials manufacturing is thin film growth in a liquid phase epitaxial (LPE) reactor with a mercury-rich melt. By a process well known in the art, a cadmium zinc telluride substrate is exposed to a solution comprising tellurium, mercury and cadmium. This process requires a system capable of withstanding the high mercury vapor pressures that occur at growth temperatures in the approximate range of 500° C., which are required to maintain the crystal growth solution in a molten form. To contain these pressures, the growth chamber of a conventional reactor is normally built from stainless steel, instead of the quartz growth chambers that can be used for low pressure reactors. These steel designs of conventional reactors provide little or no visibility of the film growth process.

Because it would be desirable to view and monitor the film growth in process, the steel chambers currently available may offer ports to view the film growth operations from the top of the chamber or from a side port using a mirror located at the top of a chamber. However, these techniques do not offer optimal visibility in that the distance from the melt to the viewing device is relatively large and the vertical vapor activity from the melt makes it difficult to see the melt across the vertical distance without interference. A quartz washer may be suspended above the melt to reduce the vertical vapor activity; but the presence of the washer may distort the viewing. Additionally, using a mirror to view the melt is awkward and leads to difficulty and complexity in the design and operation of a high pressure reactor. Finally, little external lighting is provided in current reactors, thereby making viewing of the film growth process difficult.

It has therefore become desirable to devise a reactor to allow for direct observation of film growth operations in a high pressure liquid phase epitaxy reactor. A technique for directly viewing growth operations from the side of the reactor chamber, previously not possible, will be discussed in this disclosure.

SUMMARY OF THE INVENTION

According to the invention, a high pressure liquid phase epitaxial (LPE) reactor chamber and method is provided having an opening which provides direct observation of the crystal growth process.

According to one aspect of the invention, a high pressure reactor chamber includes an enclosed reactor tube formed of inert material capable of withstanding high pressures, a transparent growth tube disposed within the reactor tube, and a crucible having transparent sidewalls capable of holding molten melt, disposed within the growth tube. The reactor tube has a first opening in a sidewall that includes a transparent sealed plate, such that the molten melt may be viewed through the opening. The reactor tube may also have second window located approximately radially adjacent the first window for projecting light to illuminate the visible surface of the melt. Preferably, the first and second windows are welded to the chamber at an angle. The reactor tube and growth tube include structure for gaining entry, such as for introducing a substrate, to the melt.

According to another aspect of the invention, the growth tube may include a reservoir, typically of mercury, located in its lower sealed end. The reactor tube may then include a lower set of windows located radially adjacent to each other, and lateral to the reservoir. One or more openings having windows may be provided, the first being used for viewing the reservoir level and the second for illuminating the surface of the reservoir. In this instance, these windows will also be capable of withstanding high pressures.

According to yet another aspect of the invention, a molten melt may be held directly in the lower sealed end of the growth tube. According to this aspect, no crucible is used. As described above, one or more openings having windows capable of withstanding high pressures may be provided for illuminating and viewing the melt.

The present invention confers several technical advantages over high pressure reactor chambers presently available in the art. The distance from the melt to the viewing device is relatively small. The invention provides the opportunity for direct observation of the crystal growth process. Any vertical vapor activity from the melt has little effect on the viewing capability. Direct illumination makes viewing the crystal growth easy. Direct observation of the growth provides consistently better quality LPE melts that are easier to use because the growth setup and operation is easier.

BRIEF DESCRIPTION OF THE DRAWINGS

Other aspects of the invention and their advantages will be discerned when one refers to the following detailed description as taken in conjunction with the drawings, in which.

DETAILED DESCRIPTION OF THE INVENTION

The preferred embodiment of the present invention is best understood by referring to FIGS. 1-4 of the drawings, like numerals being used for like and corresponding parts of the various drawings.

Figure 1:
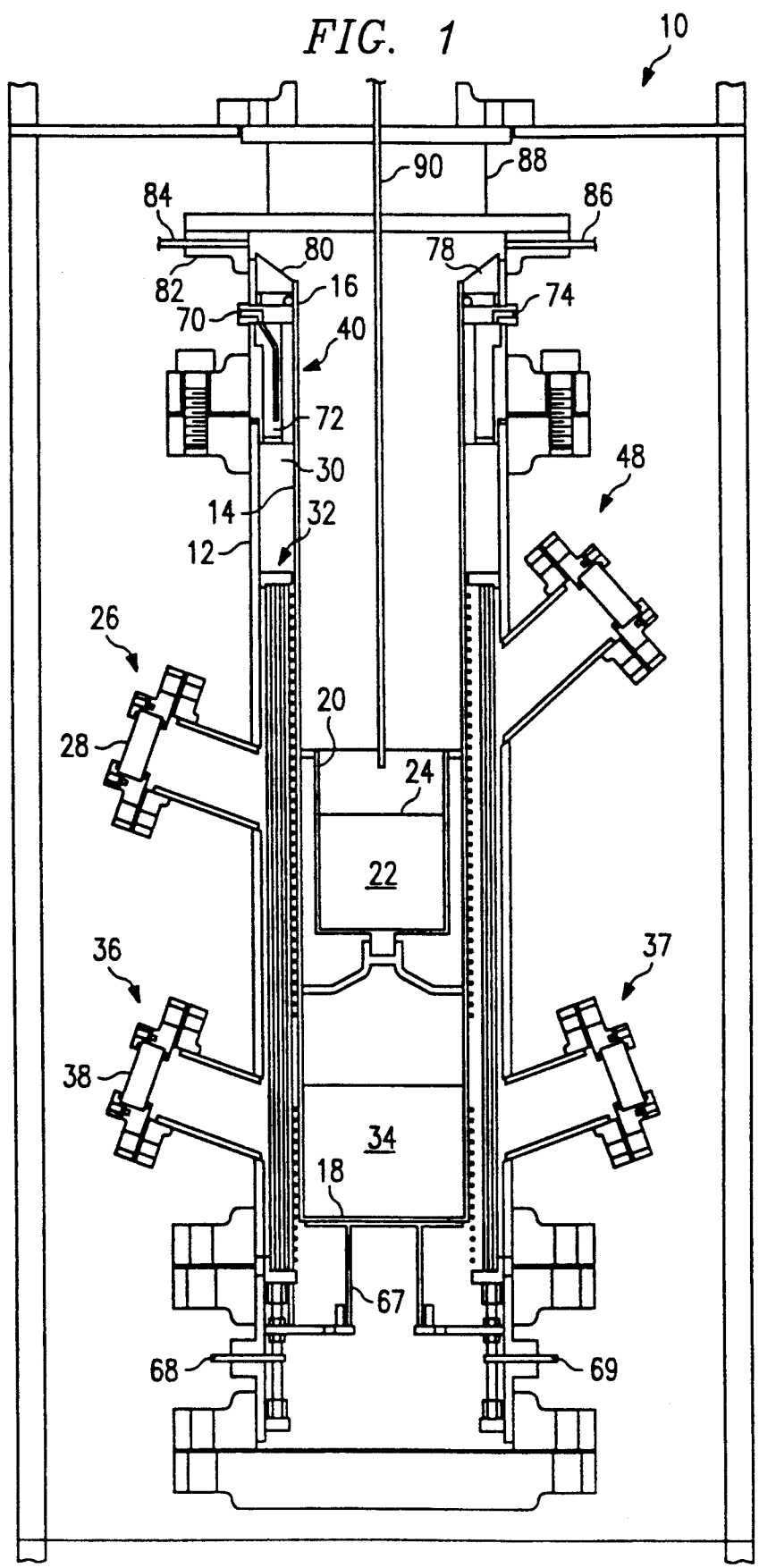
FIG. 1 is a cross-sectional, foreshortened view of the high pressure reactor tube assembly according to one aspect of the invention.

FIG. 1 is a foreshortened, cross-sectional view of a vertically oriented high pressure reactor tube assembly according to one embodiment of the invention, indicated generally at 10. The assembly 10 includes an enclosed reactor tube 12, capable of withstanding high pressures. Transparent growth tube 14 is disposed within reactor tube 12. Growth tube 14 has an open first end 16 and a sealed second end 18. Transparent crucible 20 is disposed within growth tube 14. Crucible 20 is capable of holding a molten melt 22 having a visible surface 24. A first viewport assembly 26, having a transparent sealed plate 28, is located in a sidewall of reactor tube 12, such that the molten melt may be viewed through the viewport assembly. The inside diameter of reactor tube 12 is larger than the outside diameter of growth tube 14, forming a cavity 30. Multi-zone furnace 32, described infra, is vertically oriented within cavity 30 and surrounds growth tube 14.

A reservoir 34, preferably of mercury, may be located in sealed end 18 of growth tube 14. A viewport assembly 36, having a transparent sealed plate 38, may be located in the sidewall of reactor tube 12 to enable viewing of reservoir 34. Reflux assembly 40, described infra, is located near the open end 16 of growth tube 14. Reflux assembly 40 aids in cooling the upper portion of assembly 10, above furnace 32.

Figure 2:
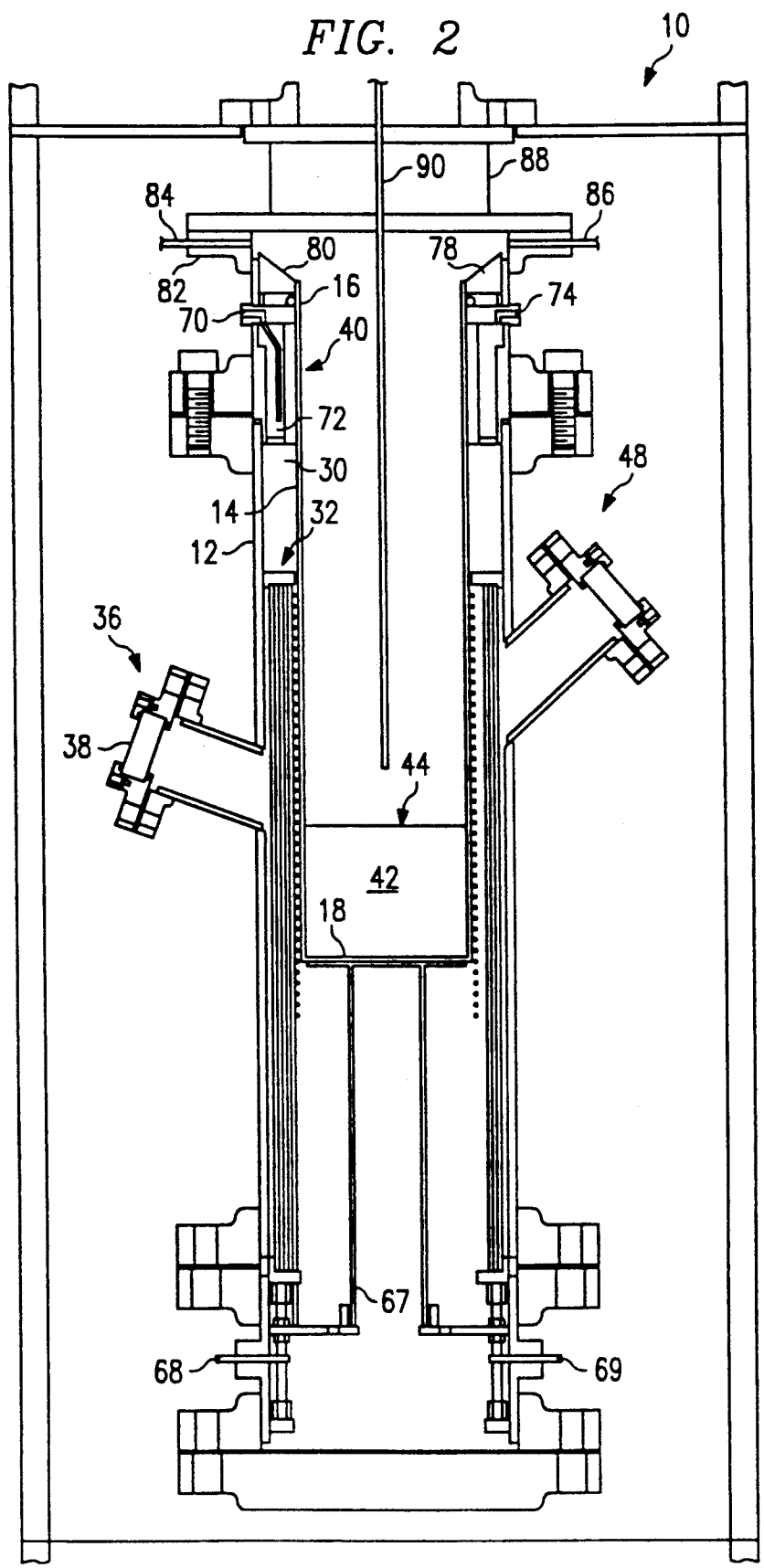
FIG. 2 is a cross-sectional, foreshortened view of the high pressure reactor tube assembly according to another aspect of the invention.

FIG. 2 is a foreshortened, cross-sectional view of a vertically oriented high pressure reactor tube assembly according to a second embodiment of the invention, indicated generally at 10. The assembly 10 includes reactor tube 12 having a growth tube 14 disposed within, as described in connection with FIG. 1, supra. However, unlike FIG. 1, a molten melt 42 having a visible surface 44 is located in sealed end 18 of growth tube 14, and no crucible 20 is used. Viewport assembly 36, having a transparent sealed plate 38, may then be used to observe the surface 44 of melt 42.

Figure 3:
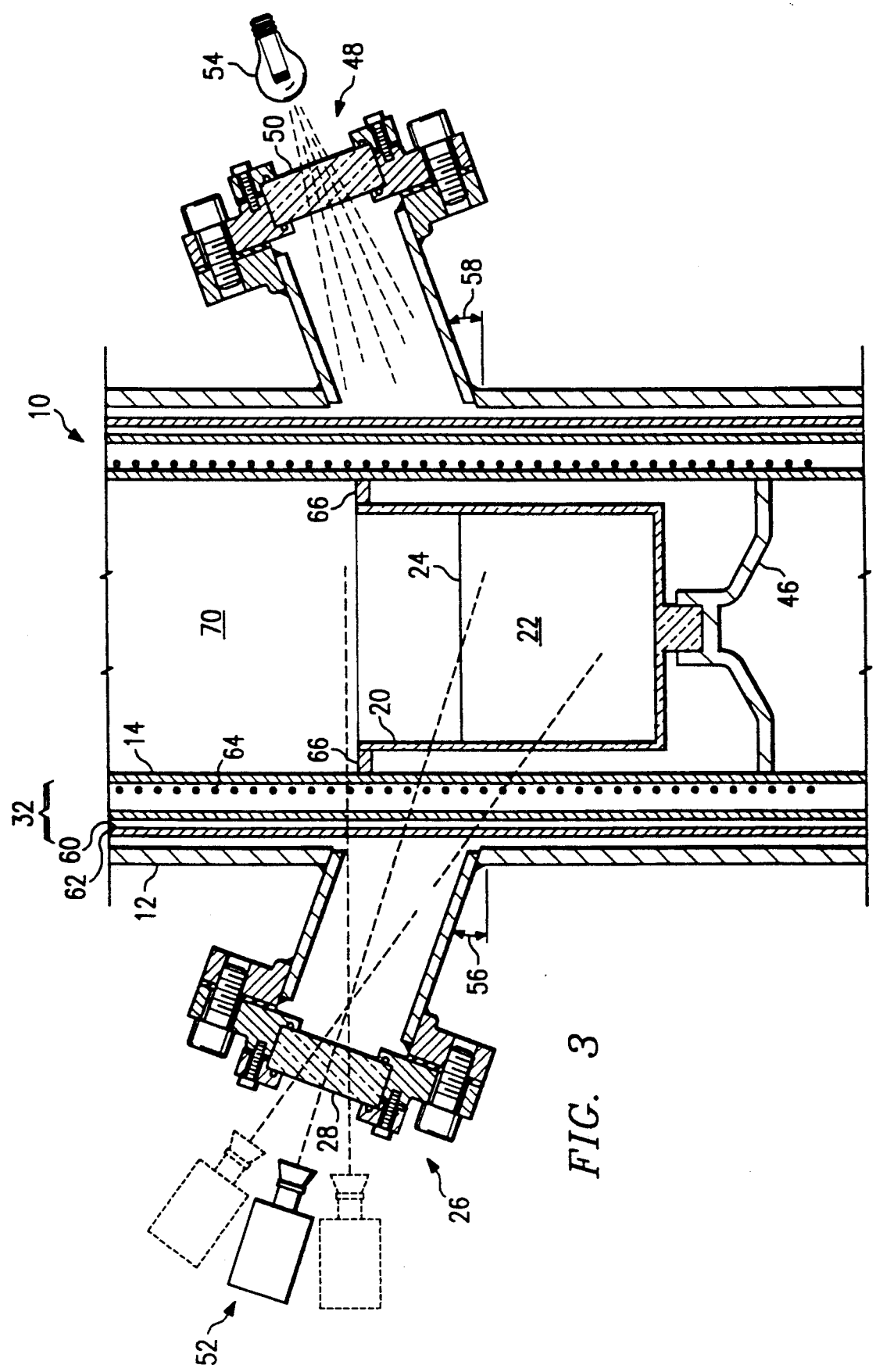
FIG. 3 is a cross-sectional view of a viewport assembly as shown in FIG. 1.

FIG. 3 illustrates a representative viewport assembly 26 located in the mid-portion of assembly 10. Viewport assembly 26, having sealed transparent plate 28, is formed in a sidewall of reactor tube 12 to enable viewing of the crucible 20, which contains the molten melt 22. Melt 22, in the preferred embodiment, includes predominately mercury, i.e., greater than 33.33 mole percent. The composition of the melt 22 is predetermined to provide the desired composition of the mercury cadmium telluride layer to be formed, described infra. Crucible 20 is supported by pedestal 46 within growth tube 14. Pedestal 46 can be of any design such that it holds crucible 20. Pedestal 46 is typically made of inert material and, preferably, is made of quartz rod.

A second viewport assembly 48 also having a transparent sealed plate 50 may be located approximately radially adjacent viewport assembly 26. In the process of the operation, a camera 52 may be located adjacent viewport 26 directed toward surface 22. Contemporaneously, a light source 54 may be located adjacent viewport 48 and directed to illuminate surface 22. As shown in FIG. 1, viewports 26 and 48 may be attached to reactor tube 12 at angles 56 and 58, respectively. Angles 56 and 58 may be determined such that optimal viewing and illumination of melt surface 44 is achieved. The preferred angle is in the range of approximately 5 to 45 degrees from the horizontal.

A vertically-oriented furnace 32, located in cavity 30, surrounds the lower and middle portion of growth tube 14. Furnace 32 is a multi-zone furnace, preferably made of quartz, such as is well-known in the art of reactor chambers. A gold film 60 is deposited on the inside of the outermost wall 62 of furnace 32 such that much of the heat in growth tube 14 is reflected back into the tube 14. Gold film 60 does not interfere with viewing surface 24 if enough external lighting is provided via source 54.

The furnace 32 is heated by passing a controlled current through heating elements 64, which surround the outside circumference of quartz tube 14, to create the desired plurality of heating zones. Multi-zone furnace 32 allows for accurate control of the temperature of melt 22 and reservoir 34, critical to the crystal growth process and the melt composition. Temperatures of the melt 22 and reservoir 34 may range from approximately 200° C. to 520° C. Additionally, this control system provides the capability of dynamically changing the temperature of the system as desired and provides flexibility in profiling the system.

The presence of reservoir 34 provides a source of pure mercury that can be used to adjust the mercury composition of melt 22, described herein. When crucible 20 is used along with mercury reservoir 34, viewport assembly 36 may be used to monitor the level of mercury in reservoir 34. Viewport assembly 37 (as shown in FIG. 1) located approximately radially adjacent viewport 36, may be provided to allow illumination of reservoir 34.

If increasing the concentration of mercury in melt 22 is desired, reservoir 34 may be heated, causing vapors to rise into the upper portion of growth tube 14. This process may be referred to as "driving the mercury". As the lower section of furnace 32 is heated, mercury from reservoir 34 converts from liquid to vapor and rises through tube 14. By not heating the furnace elements 64 located in the upper portion of tube 14 as much as those adjacent reservoir 34, in combination with the cooling effects of the reflux assembly 40, the vapor condenses and mercury droplets fall into melt 22, thereby increasing the concentration of mercury of the melt 22. The mercury can be driven from the reservoir 34 to the melt 22, as described, or vice versa, to adjust the melt composition.

When "driving" the mercury from the reservoir 34 to the melt 22, a quartz washer 66 may be placed between the outside of crucible 20 and the inside of tube 14. Optional washer 66 has holes large enough through which vapors may pass, but as the vapors cool, the condensed droplets will fall, hit the washer 66 and eventually fall into the melt 22.

The sealed end 18 of tube 14 is supported by stand 67. Stand 67 provides adjustment of the melt surface relative to the furnace elements (specifically, their transition points). This adjustment can only be made with the reactor shut down and partially disassembled. The stand's main purpose is to provide a structure to support the weight of the growth tube 14 and its contents, which can be substantial, along with the weight of the furnace assembly. Stand 67 can be made of any suitable inert material.

Figure 4:
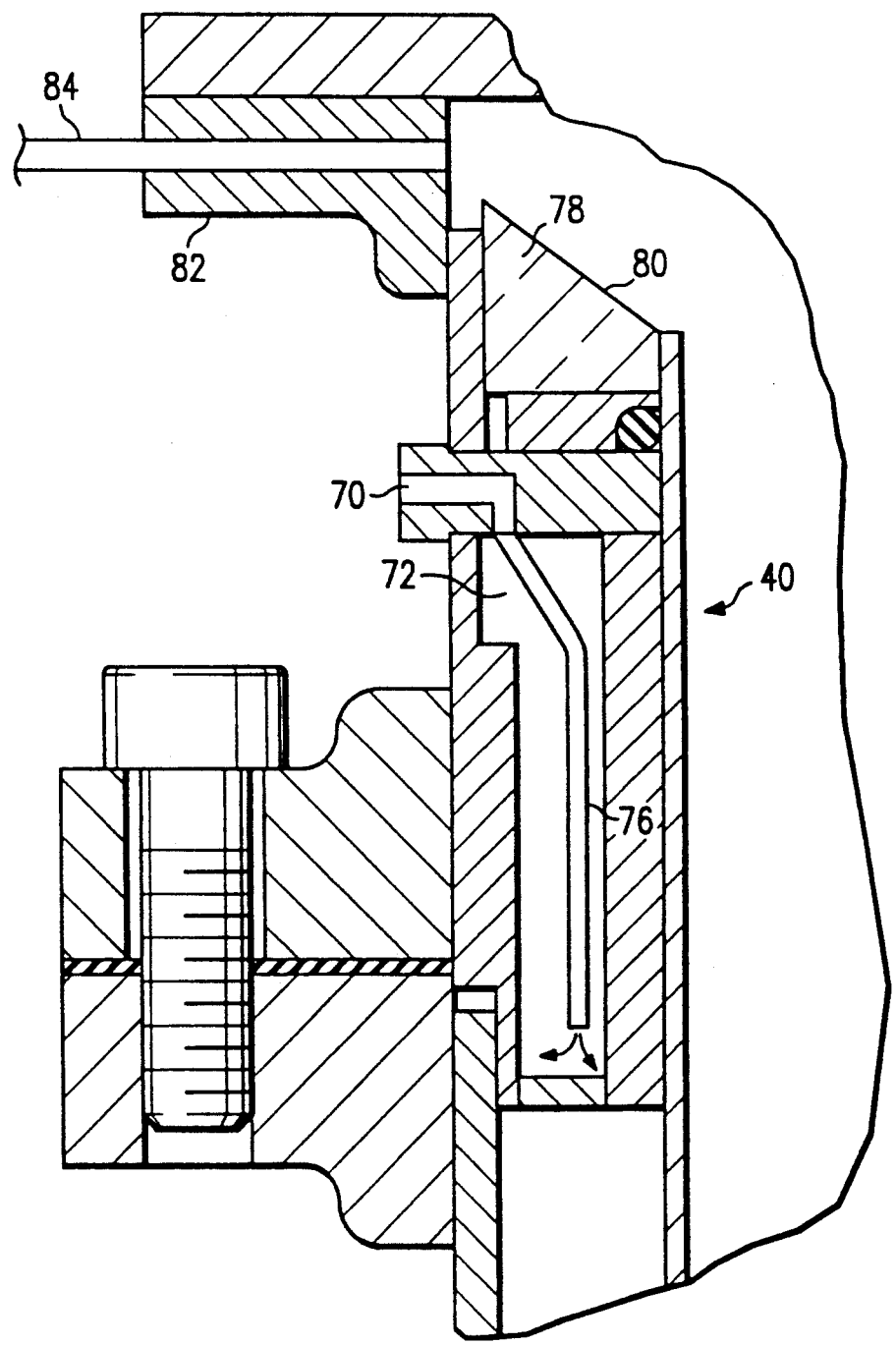
FIG. 4 is a highly magnified cross-sectional view of a reflux assembly as shown in FIG. 1.

FIG. 4 is a highly magnified cross-sectional view of reflux assembly 40. Reflux assembly 40 uses a water mixture to cool the upper portion of growth tube 14, above furnace 32. The coolant, preferably at an approximate temperature of 0° C., enters the reflux assembly 40 through an inlet 70, circulates through a cavity 72 and exits through an outlet 74. A tube 76 diverts the coolant to the bottom of reflux assembly 40. Tube 76 ensures that the coolant chills the complete interior surface of reflux assembly 40. Collar 78, preferably made of quartz, has a beveled surface 80, which helps to prevent condensed mercury from collecting between tubes 12 and 14 and above reflux assembly 40.

Flange 82 is shown located above reflux assembly 40. Inlet port 84 is located in flange 82, through which hydrogen gas ($H_2$) is introduced into the growth tube 14. Hydrogen is passed continuously through growth tube 14 during the entire crystal growth process. The hydrogen assists in keeping the composition from being degraded or contaminated. An outlet port 86 is provided through which the H₂ may exit.

The present invention recognizes that unique structure must be provided to allow the growth chamber 14 to be made from quartz. In particular, the cavity 30 between the growth tube 14 and the reactor tube 12 must be pressurized to a pressure approximately equivalent to the pressure inside the growth chamber. Transducers located near the reactor monitor the differential pressure across the quartz growth chamber. Pressure control is automatically done to keep the differential pressure small, thereby avoiding burst. To assist, in keeping the reactor tube 12 cool, nitrogen enters the lower portion of assembly 10 through port 68 and circulates throughout open areas. Nitrogen exits through port 69.

Viewport assemblies 26, 36, 37 and 48 are all formed in substantially the same manner. Each viewport is attached to an opening in tube 12 in any conventional manner. A sealed transparent plate is connected to the assembly to provide for viewing or for illuminating the melt or reservoir located within tube 14, as the case may be.

In practicing the process of the present invention using the apparatus described in FIGS. 1-4, a mercury-rich melt of predetermined composition is placed in transparent crucible 20, which is disposed within growth tube 14. Both crucible 20 and tube 14 are preferably made of quartz. Multi-zone furnace 32 is heated by passing a controlled current through the plurality of separately wound heating elements 64. A coolant, such as a water and anti-freeze mixture, is circulated through the reflux assembly 40 via the inlet 70 and the outlet 74.

Referring now back to FIG. 1, gate valve 88 is available for receiving a vertical rod 90. Rod 90 includes a wafer (not shown), which is lowered into the crucible 20.

The desired mercury cadmium telluride layer may be grown by any known process including lowering the wafer below surface 22, holding the wafer in a vertical position, or floating the wafer on surface 22 for a predetermined period of time. The melt is cooled below its liquidus temperature, discussed infra, at a predetermined rate sufficient to cause crystal growth of a layer of mercury cadmium telluride on the wafer. Cooling of the melt 22 is achieved by proper control of the current provided to the multi-zone furnace 62, with reduced current input providing reduced heating (i.e., cooling) of the melt 22. The transition from liquid to solid is approximately in the 400° C. range. The transition temperature may vary ±100° C. depending on the composition.

Direct viewing of the melt is most important during the pre-growth setup, i.e., the liquidus temperature determination. Liquidus determination is very much operator dependant, and requires the visual access to the melt surface that this invention provides. Liquidus determination is critical to LPE growth. The liquidus temperature must be accurately determined in order to (1) grow a good quality film on the wafer and (2) prevent etching back too much of the wafer material, thus shifting the melt composition. During setup, the melt is heated several degrees above the liquidus temperature of the previous run, and then cooled at small temperature increments. During cooling, the formation of crystal growth on the melt surface is monitored, which then determines the liquidus temperature. When the layer of mercury cadmium telluride has been deposited to the desired thickness, the wafer is removed from melt 22, and the crystal growth process is concluded.

By the process of the preferred embodiment of the present invention the high pressure viewport assemblies allow illumination and direct observation of the film growth and/or the reservoir bath. The transparent sealed plates, preferably made of quartz, are capable of withstanding the high pressures associated with this process. The distance from the viewport assembly 26 to the melt surface 24 is relatively short, thereby providing minimal interference from any vertical vapor activity associated with the melt.

The apparatus and process of the present invention provide a crystal growth melt such that its composition is more easily maintained, which enables the formation of more uniform and reproducible layers of mercury cadmium telluride. This composition is achieved by maintaining the volatile mercury within the crystal growth system. The condensed mercury can be driven from the reservoir to the melt, or vice versa, between growths to adjust the melt composition.

This invention was designed for a particular thin film growth reactor, but the concept could be applied to any application where it is desirable to observe any high pressure process.

Although the present invention and its advantages have been described in detail, it should be understood that various changes, substitutions and alterations can be made herein without departing from the spirit and scope of the invention as defined by the appended claims.

What is claimed is:

1. A process for forming a layer of a predetermined composition on a substrate surface, comprising the steps of:
   forming a molten melt within an enclosed reactor chamber;
   providing a condensing means having a surface vertically above said melt to condense vapors which vaporize from said melt and for returning said condensed vapors to said melt to thereby maintain said melt at a constant composition;
   contacting said substrate with said melt for a predetermined period of time while cooling said melt below its liquidus temperature sufficient to cause the crystal growth of said layer on said substrate to a predetermined thickness; and
   viewing said crystal growth of said layer through a sealed observational sidewall view port located adjacent said melt.

2. The process of claim 1, wherein said condensing means comprises a water-cooled reflux assembly.

3. The process of claim 1 wherein said view port is connected to said reactor at an angle in the range of approximately 5 to 45 degrees from horizontal.

4. The process of claim 1 wherein said reactor comprises an illumination port located approximately radially adjacent said view port and includes a projecting light in order to illuminate said melt.

* * * * *